(12) United States Patent
Patterson et al.

(10) Patent No.: US 7,902,866 B1
(45) Date of Patent: Mar. 8, 2011

(54) WIRES ON DEMAND: RUN-TIME COMMUNICATION SYNTHESIS FOR RECONFIGURABLE COMPUTING

(75) Inventors: Cameron Patterson, Blacksburg, VA (US); Peter Athanas, Newport, VA (US); John K. Bowen, Alexandria, VA (US); Timothy G. Dunham, Roanoke, VA (US); Justin D. Rice, Coral Springs, FL (US); Matthew T. Shelburne, Christiansburg, VA (US); Jorge A. Suris Pletri, Blacksburg, VA (US); Jonathan Graf, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 90 days.

(21) Appl. No.: 12/199,465

(22) Filed: Aug. 27, 2008

Related U.S. Application Data

(60) Provisional application No. 60/968,091, filed on Aug. 27, 2007.

(51) Int. Cl.
*H03K 19/177* (2006.01)

(52) U.S. Cl. .............................................. 326/41; 326/38
(58) Field of Classification Search ............... 326/37–41
See application file for complete search history.

(56) References Cited

U.S. PATENT DOCUMENTS 7,124,391 B1 * 10/2006 Patterson ........................ 716/17

OTHER PUBLICATIONS

Early Access Partial Reconfiguration User Guide, UG208 (v1.1) Mar. 6, 2006, www.xilinx.com.

* cited by examiner

*Primary Examiner* — Don P Le
(74) *Attorney, Agent, or Firm* — Blank Rome LLP

(57) ABSTRACT

A method, and system, for reconfiguring an FPGA which has a static region and a dynamic region is provided. The method includes the steps of: (a) providing a dynamic module library having information of predetermined modules; (b) receiving a reconfiguration request external to the FPGA; (c) computing reconfiguration of the FPGA at a predetermined location using predetermined module information from the dynamic module library and the reconfiguration request, and generating reconfigurable partial bitstreams; and (d) sending partial bitstreams from the predetermined location to the FPGA to perform the reconfiguration.

19 Claims, 9 Drawing Sheets

US 7,902,866 B1

WIRES ON DEMAND: RUN-TIME COMMUNICATION SYNTHESIS FOR RECONFIGURABLE COMPUTING

REFERENCE TO RELATED APPLICATIONS

The present application claims the benefit of U.S. Provisional Application No. 60/968,091, filed Aug. 27, 2007, whose disclosure is hereby incorporated by reference in its entirety into the present application.

The present application is also related to U.S. Provisional Application No. 61/084,429, filed Jul. 29, 2008.

STATEMENT OF GOVERNMENT INTEREST

The work leading up to the present invention was supported by United States Air Force Contract No. FA8651-06-C-0126. The government has certain rights in the invention.

FIELD OF THE INVENTION

The present invention is directed to field-programmable gate arrays (FPGAs), and more particularly to a method and system for configuration and reconfiguration of FPGAs during run time operations.

DESCRIPTION OF RELATED ART

FPGAs are first introduced by Xilinx, Inc. in 1985. FPGAs are semiconductor devices that can be programmed and reprogrammed to perform logic functions. Each FPGA contains hundreds or thousands of duplicated logic gates and programmable interconnects. A user or designer may compile a logic function using software provided by the FPGA vendors. The compiling of the logic function creates binary bitstreams that can be downloaded into the FPGA to instruct the FPGA's programmable interconnect to connect the logic gates to perform the designed logic function.

The FPGA allows the flexibility of reusing the logic gates for different logic functions by recompiling and reconfiguring the FPGA. However, the configuration memory of an FPGA is volatile and must be configured every time the power is up. When the power is down or off, the FPGA loses its functionality. Moreover, recompiling and reconfiguration of an FPGA is time and energy consuming.

Conventionally, whenever an FPGA is reconfigured or configured, multiple full bitstreams from a designer's computer are compiled and downloaded to the FPGA. A disadvantage is that the full bitstreams cannot be downloaded on the fly and the operation of an FPGA may have to stop prior to receiving new full bitstreams. One solution is partial reconfiguration where parts of the FPGA are constant and continuously running while other parts are reprogrammed and reconfigured.

Contemporary computer engineering tries to develop systems that create a balance between price, performance, power, adaptability and the time and cost effort required to use the technology. An axiom of reconfigurable computing research is that adding run-time adaptability to hardware can improve the three P's: price (by multiplexing the use of a smaller FPGA), performance and power efficiency. Even if such objectives are achieved, the significant increase in design effort works against the main attraction of FPGA technology. Reconfigurable application development remains daunting, largely because inter-module communication requires low-level physical design and is the responsibility of the designer. Given the effort required to develop nontrivial, run-time reconfigurable (RTR) applications, the price/performance/efficiency return on investment needs to be substantial. The current approach to partial reconfiguration leads to an intermodule communication structure that remains fixed and often consists of one or more buses. However, the pervasive lesson in high-performance architecture is the importance of efficient communication. Because FPGAs are mostly uncommitted wires, custom, point-to-point communication between dynamically instantiated modules is desired in order to maximize communication efficiency.

RTR application design would be much easier if module communication circuitry was automatically synthesized. A relatively new research area, communication synthesis is an essential part of system-on-chip design productivity. Commercial communication synthesis tools exist for application-specific integrated circuit (ASIC) design, such as Sonics' SMART. Designers need only provide a library of modules and memories (which often pre-exist as cores), and all connections and physical constraints are automatically generated. This degree of abstraction is sorely missing for RTR application development. As with software and static hardware design, reconfigurable applications should be insulated from rapidly evolving FPGA architectures.

Xilinx's efforts to promote RTR formed distinct phases that have some important lessons. Xilinx's reconfiguration-friendly XC6200 architecture was the focus of the first phase. Its commercial failure resulted from, among other things, poor support for reconfiguration in the associated tools, and a lack of architectural features (such as fast arithmetic) that designers were accustomed to. The second phase sensibly focused on reconfiguration tools for mainstream FPGA architectures, and resulted in the JBits Integrated Development Environment. Run-time parameterized designs could be implemented without using the standard Xilinx tools by having a Java program configure all logic and connections in a structural manner. However, most designers were not willing to forgo the Register Transfer Level (RTL) design abstraction with familiar Hardware Description Language (HDL) and timing-driven implementation tools.

Phase three has been in effect since 2002, and provides rudimentary support for partial reconfiguration in Xilinx's mainstream implementation tools by adding constraints and special bus macros to the modular design flow. In addition to the manual effort required to insert and place the bus macros, a number of limitations arise due to the lack of a run-time environment. A set of reconfigurable regions may be allocated in a design; however they may not be stacked vertically because different configuration frames would be required for each combination of modules. Each region must be the size of the largest module that will occupy it. Inter-module routing resources are also fixed at design time. The constraints of this static approach result in the same inflexibility or resource waste as static array allocation in programs. As with software, the solution is dynamic allocation of reusable resources from a large pool.

SUMMARY OF THE INVENTION

It is therefore an object of the present invention to provide a module-based RTR of FPGAs. Another object is to provide a flexible allocation of logic and wires from a dynamic pool and run-time adaptable point-to-point communication. It is also an object of the present invention to leverage existing design methodologies and tools and focus on streaming applications.

According to an aspect of the invention, another method for reconfiguring an FPGA which has a static region and a dynamic region is provided. The method includes the steps of: (a) receiving an FPGA reconfiguration request at a server located externally of the FPGA; (b) computing reconfiguration of the FPGA at the server, using the request and information of predetermined modules; and (c) sending partial bitstreams from the server to the FPGA to reconfigure the FPGA.

According to another aspect of the invention, yet another method for reconfiguring an FPGA which has a static region and a dynamic region is provided. The method includes the steps of (a) providing a dynamic module library having information of predetermined modules; (b) receiving a reconfiguration request external to the FPGA; (c) computing a reconfiguration of the FPGA at a predetermined location using predetermined module information from the dynamic module library and the reconfiguration request, and generating reconfigurable partial bitstreams; and (d) sending partial bitstreams from the predetermined location to the FPGA to perform the reconfiguration.

According to yet another aspect of the invention, a dynamic module system for reconfiguring an FPGA which has a static region and a dynamic region is provided. The system includes: (a) an interface for receiving a reconfiguration request; (b) a datapath manager for receiving the reconfiguration request and information of predetermined modules, wherein the datapath manager computes placement of modules inside the dynamic region of the FPGA and their interconnections; (c) a channel routing manager connected to the datapath manager for determining connections between the dynamic region and the static region; and (d) a bitstream toolbox connected to the datapath manager and the channel routing manager and generating reconfigurable partial bitstream to the FPGA via the interface.

BRIEF DESCRIPTION OF THE DRAWINGS

Preferred embodiments of the present invention will be set forth in detail with reference to the drawings, in which.

DETAILED DESCRIPTION OF THE PREFERRED EMBODIMENTS

Figure 1:
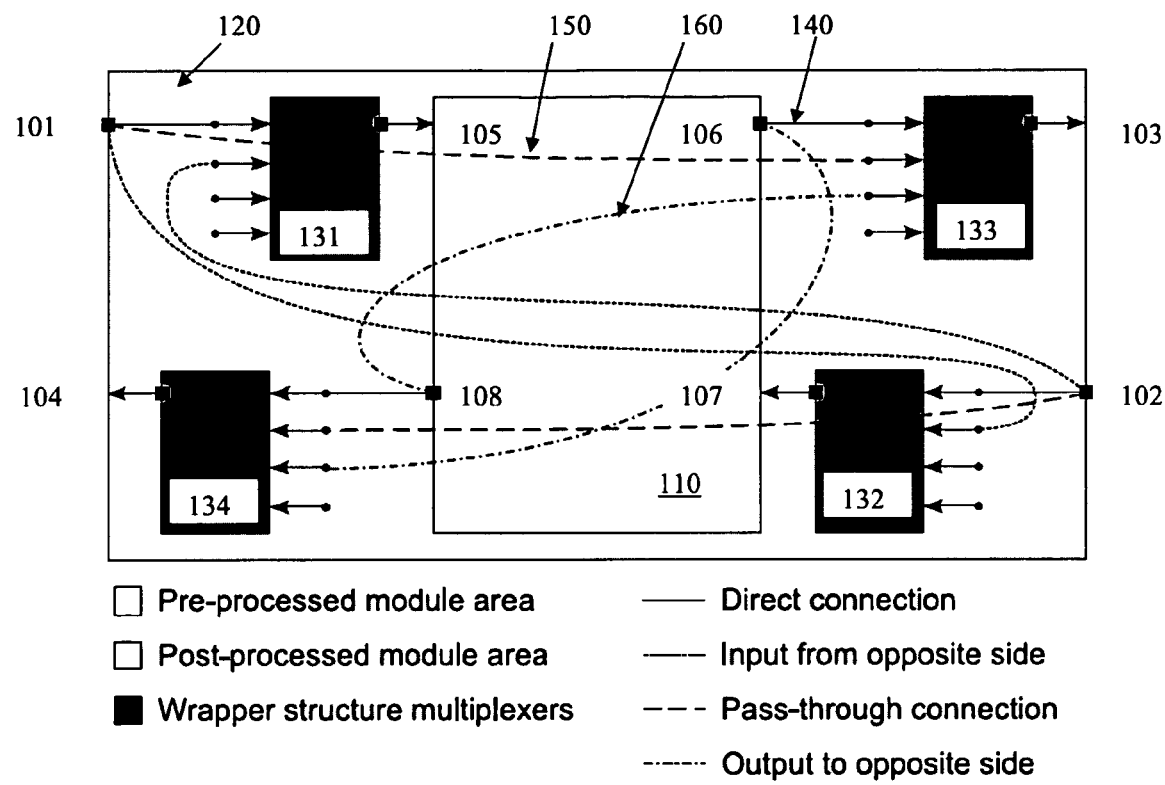
FIG. 1 is a drawing which shows an exemplary wrapper structure.

Preferred embodiments of the invention will be set forth in detail with reference to the drawings, in which like reference numerals refer to like elements or steps throughout.

The present invention divides the reconfiguration of an FPGA into two main steps: (1) creating a dynamic module library during compile-time operations (preprocessing dynamically instantiated IP) and (2) computing the reconfiguration external to the FPGA during run-time operations (placing modules and completing connections). After the reconfiguration is computed, the system sends partial bitstreams that represent the reconfiguration function to the FPGA. The FPGA contains a basic, static region and a dynamic region. The dynamic region is also called a sandbox where, as explained below, logic modules are reconfigured, placed and interconnected during run-time operations.

The dynamic module library may be created during compile time. The library is composed of preprocessed IP blocks, stored in the form of partial bitstreams. Before compilation, blocks are encased in wrapper structures whose main function is to provide routing anchor points for block ports.

An exemplary wrapper structure 100 is shown in FIG. 1. Referring to FIG. 1, the wrapper structure 100 includes two input ports 101-102, two output ports 103-104, a preprocessed module 110 with input ports 105 and 107 and output ports 106 and 108, a post-processed module 120, and four multiplexers 131-134, each having four input ports and one output port. The solid lines 140 are direct connections. The dashed lines 150 are dynamic pass-through connections. The dotted lines 160 are dynamic input or output connections from opposite sides.

The first multiplexer 131 has an input directly connected to the input 101 of the wrapper 100 and an output directly connected to the input 105 of the preprocessed module 110. Another input of the first multiplexer 131 is dynamically connected to the input 102 of the wrapper 100. The second multiplexer 132 has an input directly connected to the input 102 of the wrapper 100 and an output directly connected to the input 107 of the preprocessed module 110. The second multiplexer 132 also has an input dynamically connected to the first input 101 of the wrapper 100.

The third multiplexer 133 has an input directly connected to the output 106 of the preprocessed module 110 and an output directly connected to the output 103 of the wrapper 100. The third multiplexer 133 also has an input dynamically connected to the input 101 of the wrapper 100 as a pass-through connection so that a signal at the input 101 of the wrapper 100 can be sent to the output 103 without passing through the preprocessed module 110. The multiplexer 133 also has an input dynamically connected to the output 108 of the preprocessed module 110.

The fourth multiplexer 134 has an input directly connected to the output 108 of the preprocessed module 110 and an output directly connected to the output 104 of the wrapper 100. The fourth multiplexer 134 also has an input dynamically connected to the output 106 of the preprocessed module 110. The multiplexer 134 has another input dynamically connected to the input 102 of the wrapper 100 as a pass-through connection so that a signal at the input 102 can be sent to the output 104 without passing through the preprocessed module 110.

With the multiplexers 131-134 and the direct and dynamic connections shown in FIG. 1, the wrapper 100 has the flexibility to utilize the preprocessed module 110 in various ways as demanded by a reconfiguration request. More specifically, the multiplexers 131-134 allow run-time selection among same-side and opposite-side connections to the ports of the preprocessed module 110, and pass-through connections for signals unrelated to the preprocessed module 110.

A module interface template describes the wrapper structure required by a particular IP block. Information in the template includes the port names and ordering, preferred block dimensions, dataflow direction, and routing options (such as the number of pass-through connections). IP block preprocessing takes as its input the module's port declarations and interface template, and produces HDL and constraints for a wrapped module. The mainstream tools are then invoked to generate one or more bitstreams for the module. Defining similar interface templates for a set of modules promotes port alignment when the modules are connected.

Regarding the module placement and channel allocation during the reconfigurable computation, to reduce the time and memory requirements of the run-time placement process, placement occurs at the module level rather than at the gate level. This reduces the size of the problem from placing many thousands of cells to placing tens of blocks. Previous work often takes a naive view of the architecture by treating module placement purely as a packing problem and ignoring inter-module routing, or by considering only the architecture's logic element grid, ignoring features such as block random access memory (BRAM).

Figure 2:
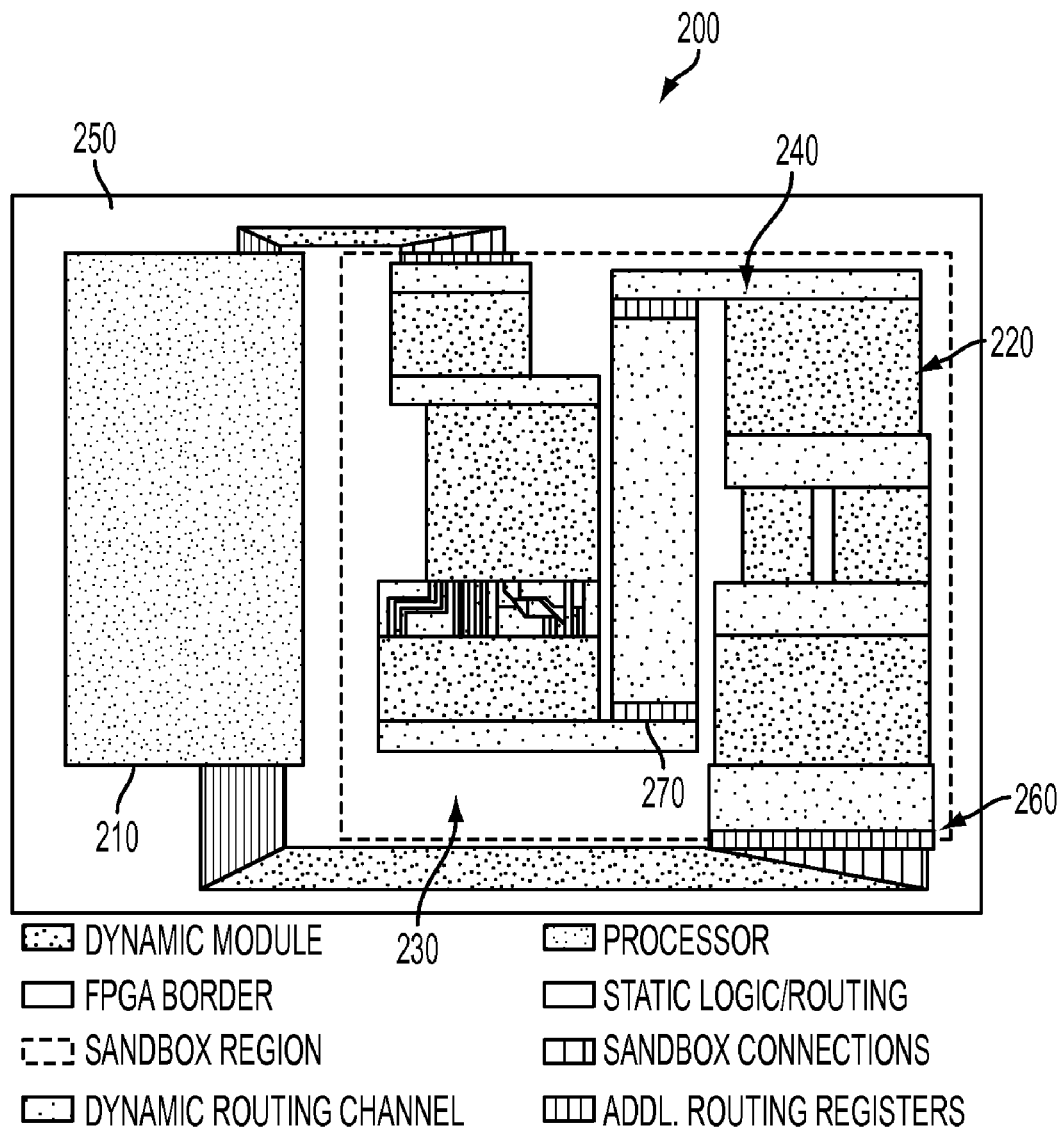
FIG. 2 is a drawing which shows a datapath placement and channel allocation inside an FPGA according to an exemplary embodiment of the present invention.

The goal of datapath placement is to promote neighbor connections and reduce routing delays between blocks by minimizing the lengths of the connecting wires. Modules are first topologically sorted based on their connections. The precise placement of modules depends on the extra resources required, such as multipliers and BRAM. Datapaths are primarily horizontal or vertical with folds as necessary. Routing channels are allocated wherever modules do not connect strictly through abutment. Within the channel, delay estimation is performed based on wire lengths. FIG. 2 shows an example of module placement and channel routing allocation in an FPGA.

Referring to FIG. 2, a configuration of an FPGA 200 is disclosed. In FIG. 2, the FPGA 200 includes a processor 210, a static logic region 250, and a sandbox 230. The sandbox 230 includes a plurality of dynamic modules 220, sandbox connections 260, a dynamic routing channel 240 and routing registers 270. The processor 210 is connected to the sandbox connections 260 to configure the connections of the modules 220 inside the sandbox 230. Inside the sandbox 230, the dynamic routing channels connect control signals received at the sandbox connections 260 to various modules 220. The size of the sandbox 230 is preferably chosen by a designer. The sandbox 230 allows a reconfiguration server to place various kinds and sizes of modules 220 inside the sandbox 230. The modules 220 inside the sandbox 230 can be interconnected in any manner using the dynamic routing channels 240.

The purposes of placing or positioning the dynamic modules 220 in the sandbox 230 are to satisfy special column alignments for BRAM and digital signal processing (DSP), promote neighboring modules' connections within datapaths, and to avoid free space fragmentation as modules 220 are removed or replaced. The purposes for channel-routing are to route between synchronous anchor points along module port edges and to achieve route delays of less than one clock period.

Regarding channel routing allocation, because contemporary FPGAs have a large amount of routing resources available, general routing is basically a graph search problem. By contrast, the inter-module routing requirements in the present invention are limited to the channels reserved between the input/output ports of adjacent modules. This approach permits routing with constructive algorithms based on templates that specify the sequence of wire segments to use.

Figure 3:
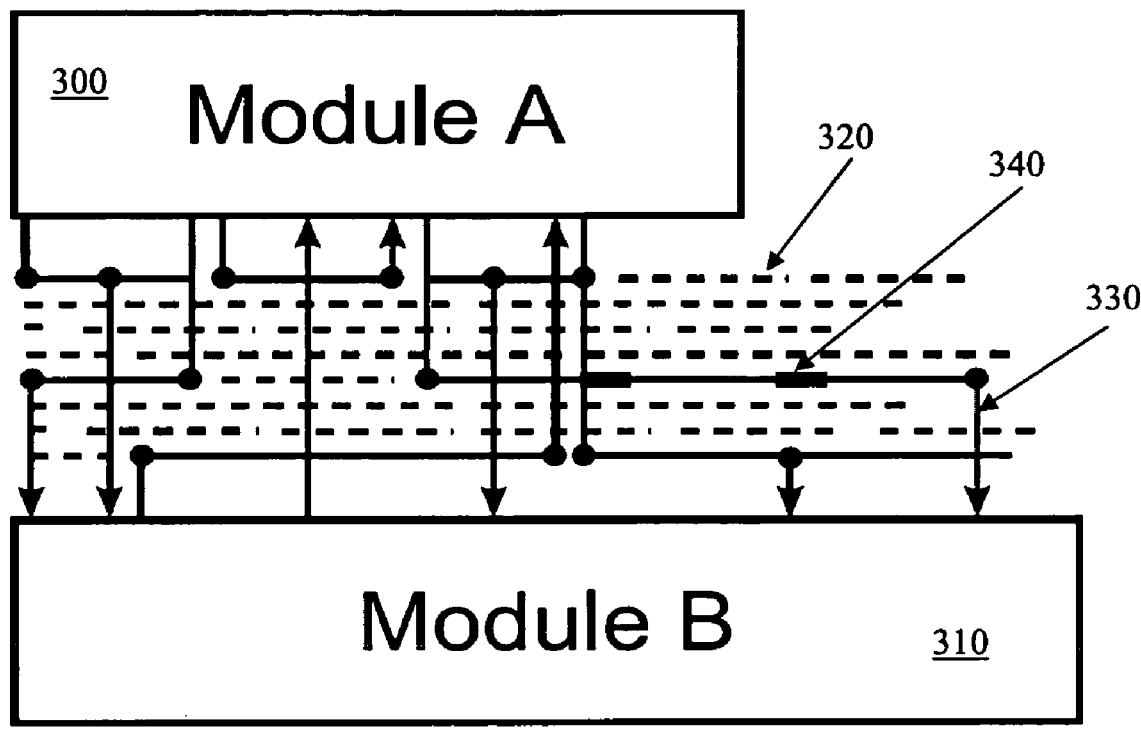
FIG. 3 is a drawing which shows an example of segmented channel connecting two modules.

FIG. 3 shows an example of how a channel connection between two neighboring modules might be realized. FIG. 3 shows Module A (300), Module B (310) and available segmented channel routes 320 between the Modules A and B. The solid lines 330 are used segments of the channel. Dashed lines 320 are unused segments. The dark rectangles 340 are joined segments.

Returning to the issue of channel allocation in an FPGA, the channel routing procedure utilizes an abstract architecture that represents a subset of the wires and connections present in a configurable logic block (CLB). By deriving the subset from resources common to two or more FPGA families, the abstract architecture allows channel routing to be treated in an architecture independent manner. The wires consist of unidirectional segments which span three CLBs and travel north, south, east or west. Each CLB contains the start, midpoint and end for ten segments in each direction. Connectivity in the abstract switch matrix is rich enough to support complex channels. After all signals have been routed in terms of the abstract architecture, routes are mapped to the corresponding resources in the actual architecture.

In addition to the local wires used for channel routing, the use of long lines for run-time connections is also considered. In the Xilinx Virtex-II/Pro architecture, long lines span the entire chip width or height as continuous segments, while in the Virtex-4 and -5 families, they span 25 and 19 CLBs, respectively. Long lines are attractive in that they are not essential resources for routing within modules. Unfortunately, they suffer from sparse connectivity among CLBs, lean connectivity to other wires within a CLB, and low density.

The low density of long lines may be prohibitive for modules having wide data ports. Long lines may be more useful for control signals related to run-time housekeeping. Such communication might include a signal from a controller instructing a module to suspend or complete the current operation and prepare to be relocated or removed.

Figure 4:
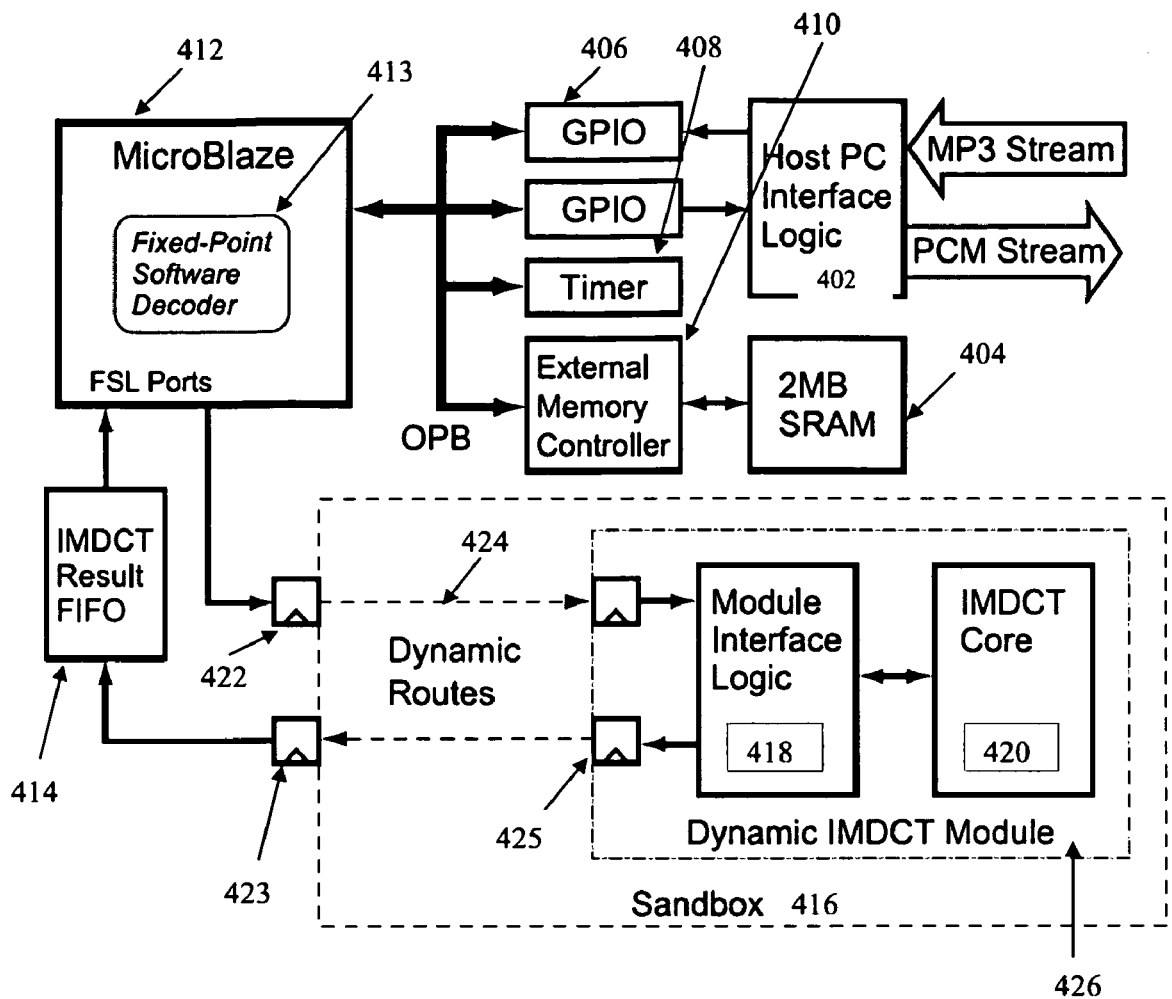
FIG. 4 is a schematic drawing which shows a MP3 decoder structure according to another exemplary embodiment of the present invention.

The following presents an example that demonstrates the feasibility of flexible module placement and communication over dynamic routes. The choice of an MPEG-1 Layer 3 (MP3) audio decoder as the application was motivated by the algorithm's reliance on streaming data transfer between signal-processing stages. As shown in FIG. 4, the decoder 400 is a system-on-chip with a 36-point inverse modified discrete cosine transform (IMDCT) core. The module is faster than the software IMDCT function by a factor of 2.54 (including communication overhead), and speeds up the overall decoding process by a factor of 1.13.

In FIG. 4, the MP3 decoder 400 includes an interface region and the FPGA region. The interface region includes the host PC interface logic 402, two general-purpose input/output (GPIO) units 406, a timer 408, an external memory controller 410, and a 2 MB static random access memory (SRAM) 404. The FPGA region includes a MicroBlaze 412, IMDCT result first-in, first-out (FIFO) unit 414, and a sandbox 416 which is equivalent to the sandbox 230 in FIG. 2.

The host PC interface logic 402 receives the MP3 stream and sends the PCM stream. The host PC interface logic 402 is connected to the GPIO units 406. The external memory controller 410 is connected to the 2 MB SRAM 404. The MicroBlaze 412 is connected to the GPIO units 406, the timer 408, and the external memory controller 410 via the on-chip peripheral bus (OPB). The MicroBlaze 412 has a fixed point software decoder 413 and FSL input/output ports. An output port of the MicroBlaze 412 is connected to input anchor-point port 424 of the sandbox 416. The sandbox 416 has an output anchor-point port 423 connected to the IMDCT Result FIFO 414, which sends signals to an input port of the MicroBlaze 412. The sandbox 416 includes dynamic routes, anchor-point ports 422-423, and a dynamic IMDCT module 426. The IMDCT module 426 includes a module interface logic 418 and an IMDCT core 420. The module interface logic 418 is connected to the dynamic routes of the sandbox 416 via the input/output anchor-point ports 424-425.

In operation, the host PC interface logic 402 sends an MP3 partial bitstream to the MicroBlaze 412 via the GPIO 406. The MicroBlaze 412 then sends the MP3 partial bitstream to the sandbox 416 to configure the modules and their connections inside the sandbox 416.

Figure 5:
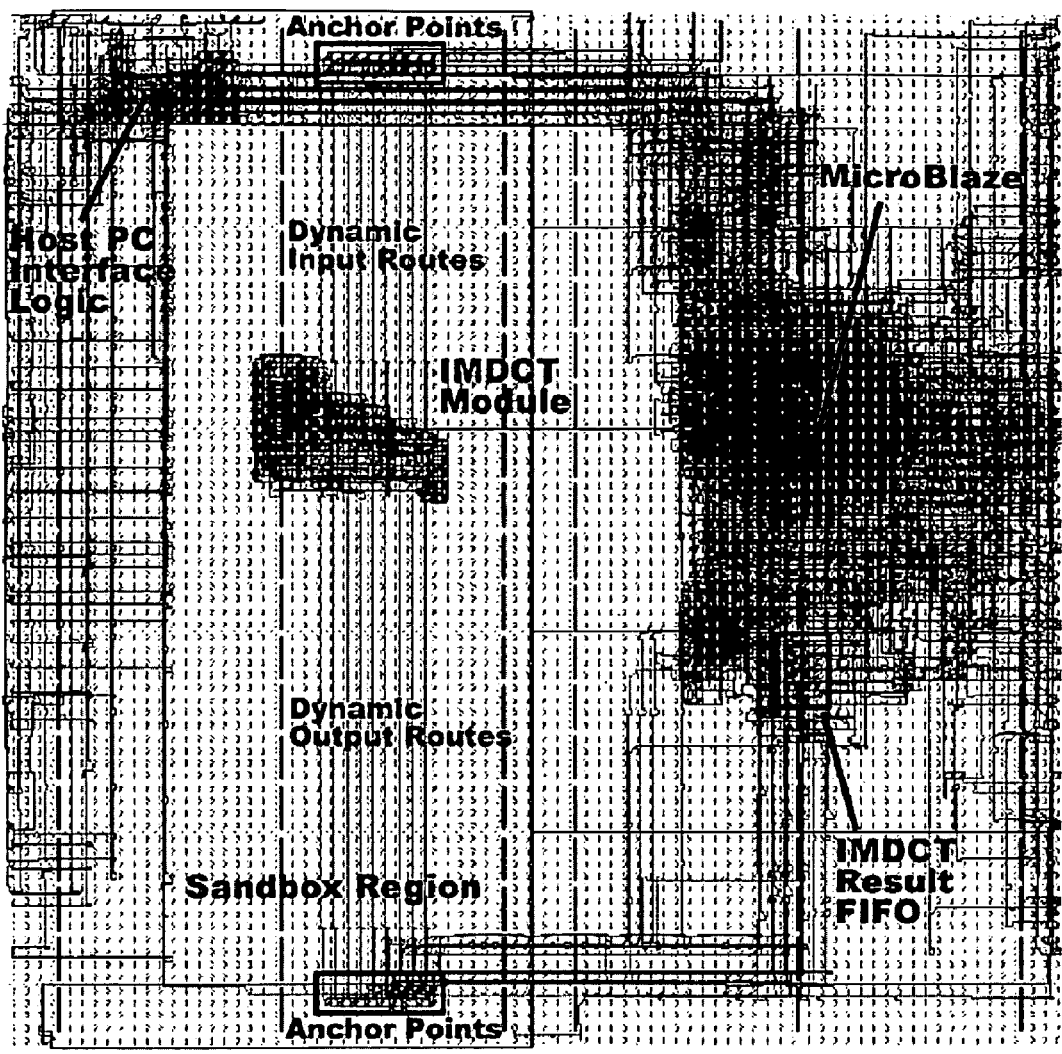
FIG. 5 is a schematic drawing which shows a MP3 decoder implementation.

FIG. 5 shows the MP3 decoder implementation on a Xilinx Virtex-II XC2V4000 FPGA. Because the module does not communicate with other dynamic modules, it uses long-line-specific anchor points rather than the wrapper described above. Through run-time-generated partial bitstreams, the IMDCT module is dynamically loaded, removed, and vertically repositioned within the sandbox region. By coordinating the reconfiguration with the software application, these changes can take place while other phases of the decoding process continue in software. Due to the long lines' sparse connection points, the module is restricted to nine positions within this sandbox, occurring at intervals of six CLBs. Streams are correctly decoded with the module absent or in any of the positions.

The IMDCT module utilizes two BRAMs and one 18×18 multiplier cell. Four distinct vertical alignments of these cells can occur within the module, depending on its placement. To address alignment, the module is implemented and stored for all four possibilities at build time. When generating a partial bitfile for a particular vertical position, the run-time tools draw from the appropriate implementation. Note that, due to the six-CLB relocation restriction, only two distinct cell alignments occur in this design.

Dynamic route timing is managed with a simple, conservative approach. In FIG. 4, each dynamic net is "bookended" by registers on both end points. By establishing at design time that the worst-case dynamic route delay is less than one clock period, no timing consideration is required at run-time. The mainstream tools implement and verify timing for routes outside the bookend registers.

A data-push protocol accommodates the two-cycle latency introduced by the bookend registers without the loss of throughput. The hardware and software interfaces guarantee that the receiver can always accommodate the number of data items to be transferred. This guarantee eliminates the need for handshaking signals from the receiver, allowing either sender to push one 32-bit sample per clock cycle.

Anchor points are the bridge between static and dynamic routes. Hard macros instanced by a build-time flow include physical module pins. Dynamic nets are bookended by registers within the anchor points. This allows a synchronous boundary between static and run-time timing verification. In addition, mainstream tools can verify timing for static routes at build time. The run-time framework manages timing between bookend registers, in which dynamic routes need only attain a delay less than one clock period and conservative delay estimates for the router's wire segments. Typically there is no timing pressure for the router, thus allowing ample slack. For long-haul routes, the router may instance additional registers. For maintaining the communication performance, protocols that accommodate bookend latency are used for module interface logic. Protocols and interfaces are designed for streaming transfers with no throughput compromise.

Figure 6:
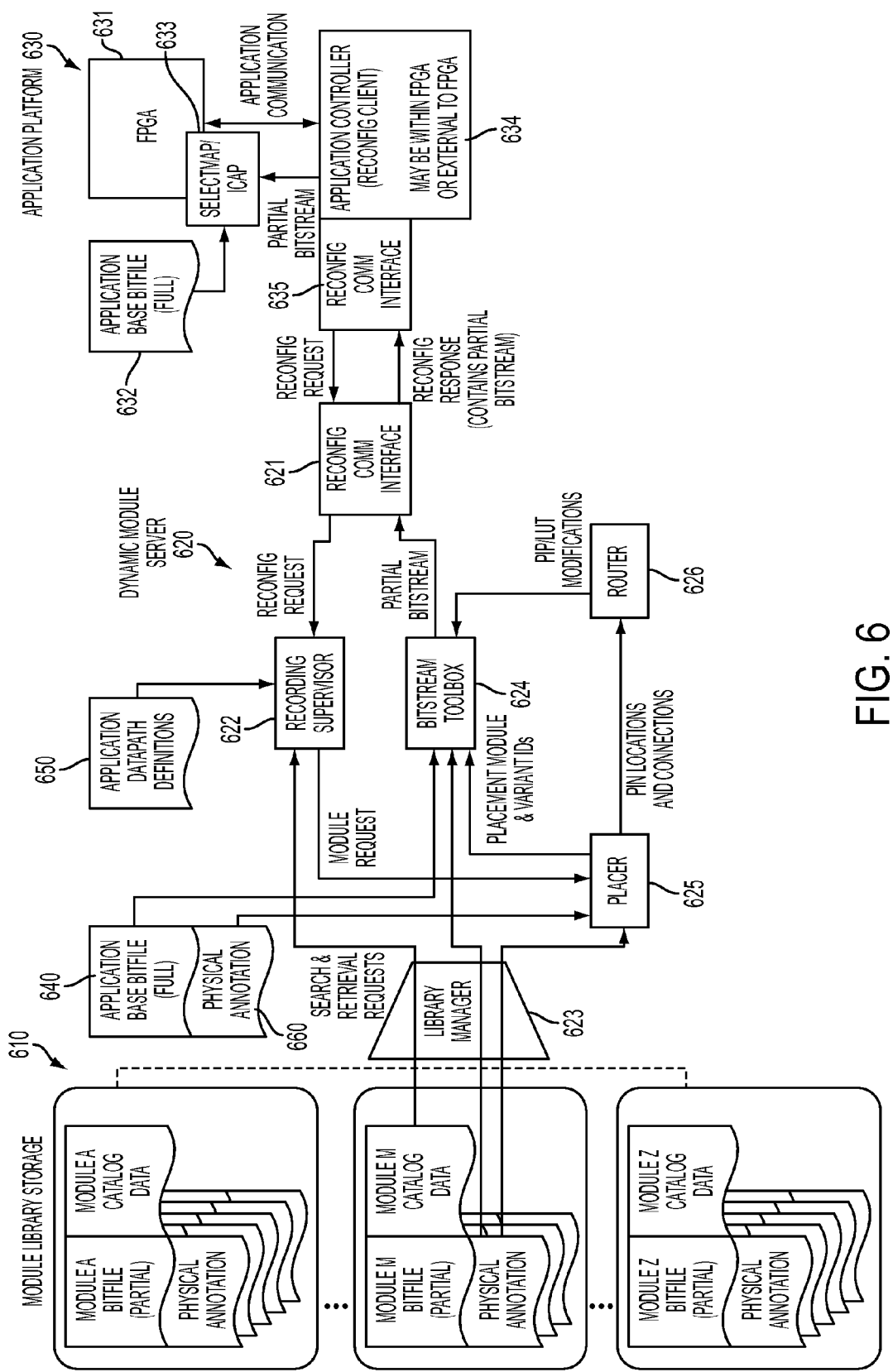
FIG. 6 is a schematic drawing which shows a run-time flow of a reconfiguration computing structure according to yet another exemplary embodiment of the present invention.

FIG. 6 shows a schematic overview of a reconfiguration system 600 for computing the reconfiguration of an FPGA during run-time operations, according to an exemplary embodiment of the present invention. The reconfiguration system 600 includes a dynamic module library storage 610, a dynamic module server 620, and an application platform 630 having an FPGA 631 to be reconfigured.

The dynamic module library storage 610 includes logic-gate Modules A through Z. Each module is preprocessed and contains a partial bitstream, physical annotation, and catalog data of the module. Physical annotation is an Extensible Markup Language (XML) file created by the preprocessor for each module. The XML file describes the dimensions of the module, location of the ports on the module's wrapper, and any special resource or alignment requirements for the module.

The dynamic module server 620 includes a reconfigurable communication interface 621, a reconfigurable supervisor 622, a library manager 623, a bitstream toolbox 624, a placer 625 and a router 626.

The application platform 630 includes the FPGA 631, an application base full bitstream 632, a SelectMap/ICAP 633, an application controller 634, and a reconfigurable communication interface 635. The interface 635 of the application platform sends signals to and receives signals from the interface 621 of the server 620. The application controller 634 may be located within the FPGA 631 or external to the FPGA 631. FIG. 6 further includes an Application Base Full Bitfile 640 with physical annotation 660 and Application Datapath Definitions 650 connected to the dynamic module server 620. The Application Datapath Definitions 650 defines the sandbox dimensions, resources available such as memory and DSP blocks, and input/output port locations.

The main function of the dynamic module server 620 is three fold: datapath management, channel routing, and bitstream interfacing. With datapath management, the server takes a reconfiguration request from a designer, selects the dynamic modules available in the module library 610 to carry out the request and determines placement of the selected modules in the sandbox inside the FPGA 631. The server 620 then performs the channel routing, i.e., determining how the selected modules are interconnected and how they are connected to the devices in the static region and the input/output ports of the FPGA 631. The server 620 subsequently sends bitstreams that represent the reconfiguration task to the application platform 630 via the interfaces 621 and 635 in order to execute the reconfiguration of the FPGA 631. The operation of the server 620 occurs during the run time of the FPGA 631.

In operation, initially the application platform 630 receives a request for reconfiguration of the FPGA 631 from a designer. The device making the request could be a processor external to the FPGA 631, or an embedded processor within the FPGA 631. Upon receiving the reconfiguration request, the application platform 630 sends the request to the dynamic module server 620 via the reconfigurable communication interfaces 621 and 635.

In the dynamic module server 620, the reconfiguration supervisor 622 receives the reconfiguration request via the interface 621, a list of available datapaths for the application of the request from the Application Datapath Definitions 650, and a list of available dynamic modules A-Z from the module library storage 610. After analyzing the request and utilizing the information about the available modules and datapaths, the reconfiguration supervisor 622 selects the modules and datapaths and sends a module request to the placer 625. Upon receiving the module request, the placer 625 retrieves selected modules from the module library storage 610 and physical annotation of the selected modules. The placer 625 determines how the selected modules are placed in the sandbox in the FPGA 631 and sends information regarding the module placement, module and variant identifications to the bitstream toolbox 624.

The router 626 receives the module connections and pin locations from the placer 625 and sends modifications of programmable interconnect points (PIP) and lookup tables (LUT) to the bitstream toolbox 624. The bitstream toolbox 624 gathers the data from the placer 625 and router 626, module information from the library storage 610, and a full bitstream of the Application Base Bitfile 640, and generates partial bitstreams to the FPGA 631 via the interfaces 621 and 635. The partial bitstream reconfigures the FPGA 631 according to the reconfiguration request.

The reconfigurable communication interfaces 621 and 635 may be a physical interface, e.g., an Ethernet connection, between different computer systems, or just a logical interface between the application platform and the dynamic module server software components running on the same computer system. The reconfiguration interface 635 is available to the FPGA application platform 630 via a network or on-board link, and to a command line shell on the server workstation.

The module server 620 thus presents a generic interface for RTR requests because it gets a list of datapaths available for the application, a list of available modules A-Z from the library 610, a list of datapaths currently in the system and a list of modules present in a datapath. The server 620 also adds or removes a datapath, replaces a module in a datapath, generates partial bitstreams that cover all changes since last bitstream.

Figure 7:
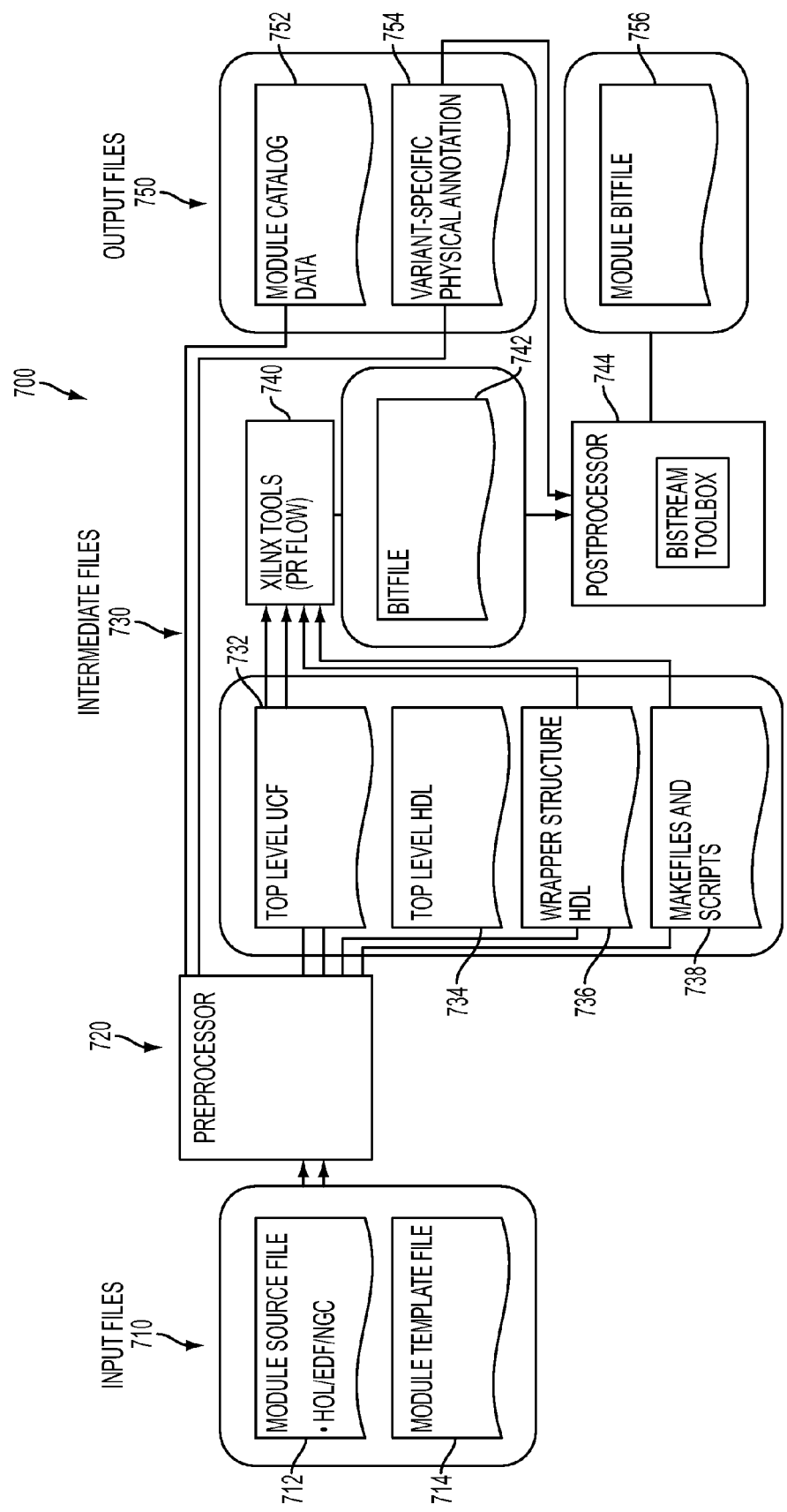
FIG. 7 is a drawing which shows a schematic view of a module-library build flow according to yet another exemplary embodiment of the present invention.

FIG. 7 shows an overview of the compile-time flow 700 that builds the dynamic module library 610. The compile-time flow 700 includes input files 710, a preprocessor 720, intermediate files 730, and output files 750. The input files 710 include module source files 712 (such as HDL/EDIF/NGC) and prepared module template file 714 describing the modules. The preprocessor 720 is connected to receive information from the module source files 712 and module template file 714 and produces the intermediate files 730 and output files 750. The intermediate files 730 include a top-level UCF 732, top-level HDL 734, wrapper structure HDL 736, and makefiles and scripts 738. The intermediate tools 730 also includes Xilinx tools 740 which is connected to receive information from the top-level UCF 732, top level HDL 734, wrapper structure HDL 736 and makefiles and scripts 738. The Xilinx tools 740 send a bitfile 742 to the post-processor 744. The module bitfile 742 is processed by the bitstream toolbox in the post-processor 744. The output files 750 include a module catalog data 752, variant-specific physical annotation 754, and module bitfile 756.

In operation, the compile-time flow 700 creates a folder structure to store the dynamic modules, executes the preprocessor 720 and platform implementation tools 740, and calls the postprocessor 744. The output of the operation is a partial bitstream, which includes only the configuration bits, and an XML description file, both of which are stored in the dynamic module library for use during the run-time operations.

Figure 8:
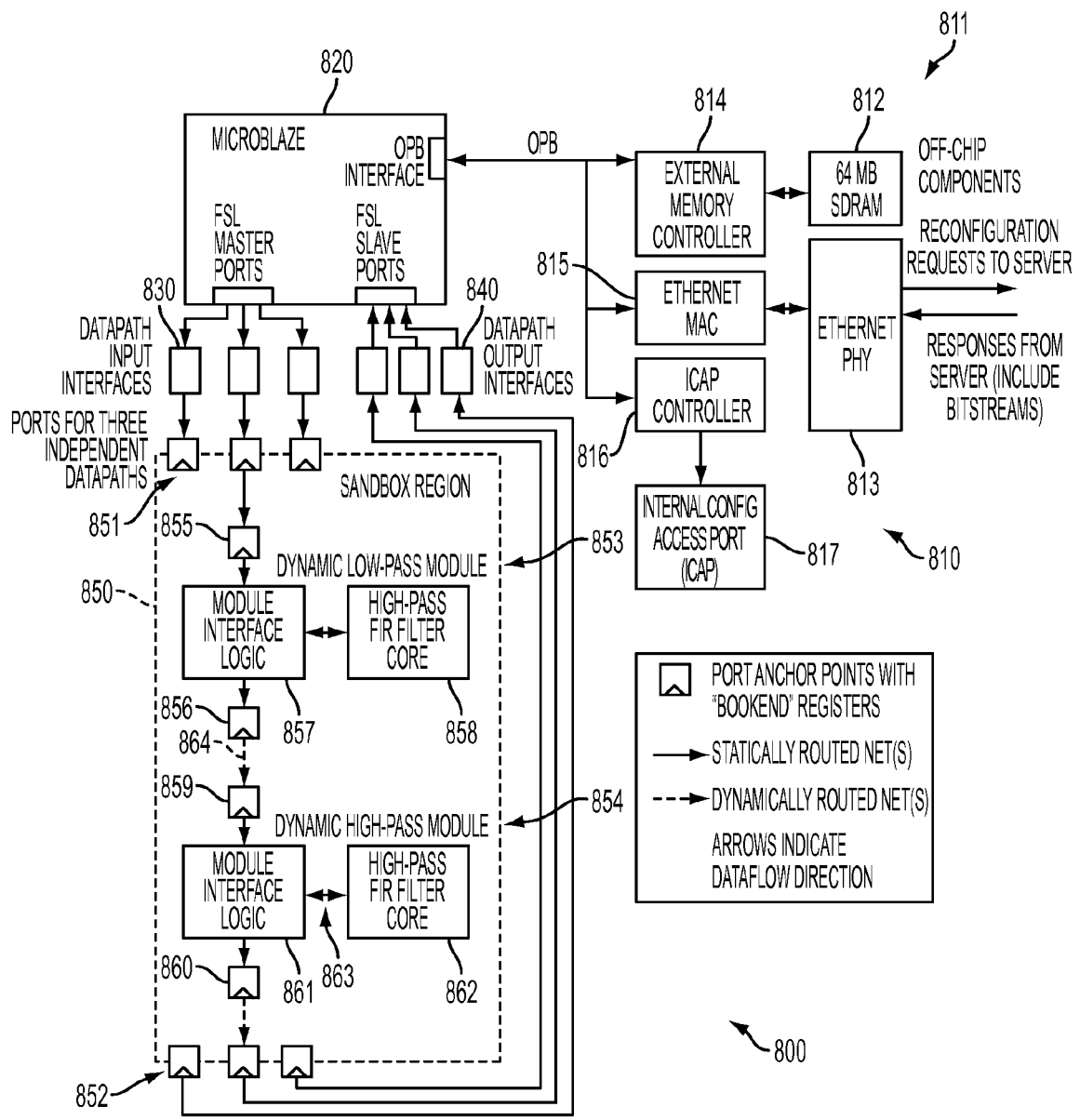
FIG. 8 is a schematic drawing which shows an exemplary FPGA application platform using cascaded filters.

FIG. 8 shows an exemplary FPGA application platform 800 according to yet another embodiment of the present invention. The application platform 800 includes the reconfiguration communication interface region 810 which includes an Off Chip Components region 811 having a 64 MB SDRAM 812 and Ethernet PHY 813. The communication interface region 810 also includes an external memory controller 814, an Ethernet MAC 815, an internal configuration access port (ICAP) 817, and an ICAP controller 816. The 64 MB SDRAM 812 is connected to the external memory controller 814. The Ethernet PHY 813 is connected to the Ethernet MAC 815. The ICAP controller 816 is connected to control the internal ICAP 817.

The application platform 800 further includes a MicroBlaze 820, three datapath input interfaces 830, three output datapath interfaces 840, and a sandbox region 850. The MicroBlaze 820 of the FPGA has an on-chip peripheral bus (OPB) interface port connected to the external memory controller 814, Ethernet MAC 815, and ICAP controller 816. The MicroBlazer 820 also has FSL master ports and FSL slave ports. The master ports send information to the three datapath input interfaces 830 while the slave ports receive information from the three datapath output interfaces 840.

The sandbox 850 includes three input port anchor points 851 for three independent datapaths and three output port anchor points 852, a dynamic low-pass module 853, and a dynamic high-pass module 854. The dynamic low-pass module 853 includes an input port anchor point 855, output port anchor point 856, a module interface logic 857 connected to a low-pass FIR filter core 858. The dynamic high-pass module 854 includes an input port 859, an output port 860, a module interface logic 861 connected to a high-pass FIR filter core 862. The low-pass module 853 and high-pass module 854 are connected in cascade. In the sandbox 850, solid lines 863 are static connections and dashed lines 864 are dynamic connections. The input ports 851 for the three independent datapaths are dynamically connected to the module interface logic 857 of the dynamic low-pass module 853. The module interface logic 857 then sends the data to the module interface logic 861 of the dynamic high-pass module 854. The module interface logic 861 of the high-pass module 854 sends a dynamical output signal to the output ports 852 of the sandbox 850 to the datapath output interfaces 840.

The dynamic filter modules 853 and 854 may be single-channel FIR filters. The modules 853 and 854 may incorporate BRAM and DSP48 Slices. The platform may be a Virtex-4 platform such as an Avnet/Memec V4LX60 MB board containing a Xilinx XC4VLX60 FPGA. The input and output ports 851, 852, 855, 857, 859, and 860 are port anchor points with bookend registers.

Figure 9:
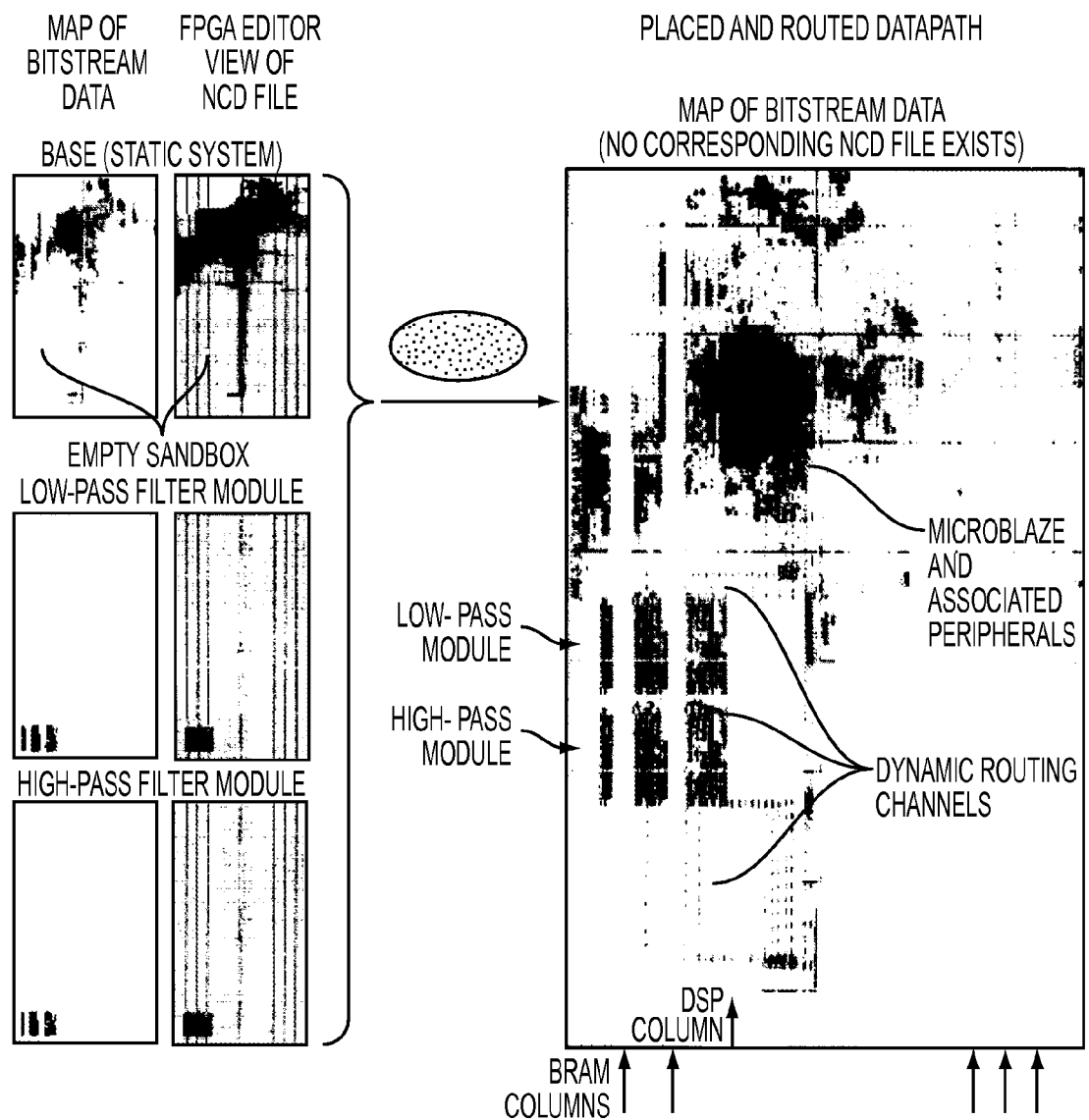
FIG. 9 is a schematic drawing which shows an exemplary map of bitstream data on the fly.

The present invention with the partial bitstreams and reconfiguration computing external to the FPGAs allows reconfiguration on the fly. FIG. 9 shows how the bitstreams on the fly flow when the sandbox 850 is empty and when the low-pass filter module 853 and high-pass filter module 854 are added to the datapath in the sandbox 850. With the partial bitstreams generated by the dynamic module server 620 in FIG. 6, such in-house bitstream tools enable rapid system composition.

The present invention provides numerous capabilities. For example, the present invention provides the following capabilities for the Xilinx Virtex-II (Pro) and Virtex-4: block copy/mask module instantiation; individual PIP control in all general interconnect tiles and select global clock tiles; assign LUT functions; read/write for full, active partial and inactive partial bitstreams; and graphical and text-based maps of configuration data including a surrogate for FPGA Editor graphics.

Table 1 below shows the performance of the dynamic module server. In this instance, the server platform specifications include Intel Pentium M 1.6 GHz, 512 MB RAM. The execution time includes: reading module bitfiles and ancillary data from hard disk files and writing partial bitstream to memory in preparation for network transfer, not to a disk file.

TABLE 1

| Reconfiguration Request | Create datapath with two FIR filter modules in empty sandbox | Remove second filter module from the datapath |
|---|---|---|
| Number of channels routed | 3 | 1 |
| Datapath analysis and module placement | 102 ms | 86 ms |
| Routing | 360 ms | 191 ms |
| Bitstream Generation | 557 ms | 435 ms |
| Miscellaneous Tasks | 121 ms | 98 ms |
| Total Time (from request to completed bitstream) | 1140 ms | 810 ms |

In the present invention, four application platforms are targeted: a standalone FPGA, an FPGA with an external processor, an external server network connected to multiple FPGAs, and a server controlling a cluster of FPGAs. It should be noted that the application platforms are not limited to only these four platforms. Across all platforms, the user application does not necessarily directly manage any reconfiguration or relocation that is taking place. The application programming interface (API) provided to reconfigurable applications hides the location of the configuration control and data. For example, loading a partial bitstream is a basic function in all platforms, although the source of the bitstream may be local (for the standalone and embedded variants) or from a server (for the networked and cluster environments). When an application is ported from one platform to another, the basic interface does not change even though new services may be requested such as module relocation.

In the standalone variant a single FPGA reconfigures itself, preferably through a processor or controller on the FPGA. The processor or controller loads bitstreams through the internal configuration access port from internal or external memory, and could use configuration flash to store partial bitstreams. The on-board controller has relatively modest computing power, which limits its operations to simple module loading and swapping. This platform suits small FPGAs with few dynamic regions, such as those that might be used in, for example, a micro unmanned aerial vehicle (UAV). An on-board controller monitors external signals and requests from the modules currently instantiated on the chip.

The embedded variant is similar to the standalone platform, except that the controller is external to the FPGA. This increases the space available for reconfiguration on the FPGA, allowing more application modules to be managed. A coprocessor architecture is provided, wherein a general-purpose processor serves as both the module controller and the host processor, while the FPGA accelerates specialized processing tasks. Software defined radio (SDR) systems could also leverage this variant's ability to use a controller to swap waveforms, as defined by partial bitstreams, without interrupting SDR operation.

The present invention disclosed above provides a module-based RTR of FPGAs, flexible allocation of logic and wires from a dynamic pool, and run-time adaptable point-to-point communication. The present invention also provides a library of modules managed by an RTR server, automated tool flow and architecture independent framework. Finally, the invention focuses on streaming applications and using leverage existing design methodologies and tools.

While preferred embodiments of the invention have been set forth above, those skilled in the art who have reviewed the present disclosure will readily appreciate that other embodiments can be realized within the scope of the invention. For example, although the term "reconfiguration" is used throughout the disclosure herein, but it should be understood that the present invention is applicable equally to the configuration of the FPGAs at power up. Also, numerical values are illustrative rather than limiting. Therefore, the present invention should be construed as limited only by the appended claims.

We claim:

1. A method for reconfiguring an FPGA which has a static region and a dynamic region, the method comprising:
    (a) receiving an FPGA reconfiguration request at a server located externally of the FPGA;
    (b) computing reconfiguration of the FPGA at the server, using the request and information of predetermined modules; and
    (c) sending partial bitstreams from the server to the FPGA to reconfigure the FPGA;
    wherein the dynamic region is configured such that the modules to be located in the dynamic region are not constrained to lie within regions defined within the dynamic region, but instead may be placed as resources in the dynamic region allow.

2. The method of claim 1, further comprising:
    (d) providing a dynamic module library having the predetermined module information.

3. The method of claim 2, wherein step (d) of providing the dynamic module library is performed during compile time; and step (b) of computing the reconfiguration is performed during run time.

4. A method for reconfiguring an FPGA which has a static region and a dynamic region, the method comprising:
    (a) receiving an FPGA reconfiguration request at a server located externally of the FPGA;
    (b) computing reconfiguration of the FPGA at the server, using the request and information of predetermined modules; and
    (c) sending partial bitstreams from the server to the FPGA to reconfigure the FPGA;
    wherein step (b) of computing the reconfiguration comprises:
    (b-1) selecting a list of modules using the predetermined module information;
    (b-2) determining placement of the modules in the dynamic region of the FPGA using the list of selected modules and the reconfiguration request;
    (b-3) determining connections among the selected modules;
    (b-4) determining channel routing between the selected modules in the dynamic region and the static region;
    (b-5) generating the reconfigurable partial bitstreams using information generated from steps (b-2), (b-3) and (b-4).

5. The method of claim 4, wherein the partial bitstreams perform placement of the selected modules inside the dynamic region of the FPGA, interconnect the modules, and create channel routing between the static region and the dynamic region.

6. A method for reconfiguring an FPGA which has a static region and a dynamic region, the method comprising:
    (a) providing a dynamic module library storing predetermined modules;
    (b) receiving a reconfiguration request external to the FPGA;
    (c) computing reconfiguration of the FPGA at a predetermined location using the reconfiguration request and the predetermined module information from the dynamic module library, and generating reconfigurable partial bitstreams; and (d) sending partial bitstreams from the predetermined location to the FPGA to perform the reconfiguration;

wherein the dynamic region is configured such that the modules to be located in the dynamic region are not constrained to lie within regions defined within the dynamic region, but instead may be placed as resources in the dynamic region allow.

7. The method of claim 6, wherein the dynamic module library is created at compile time; and wherein step (c) is performed during run time of the FPGA.

8. The method of claim 7, wherein the predetermined location is a dynamic module server.

9. The method of claim 6, wherein step (c) comprises:
 (c-1) retrieving a list of datapaths available in the FPGA;
 (c-2) selecting modules from the predetermined modules for the reconfiguration; and
 (c-3) determining placement and connections of the selected modules in the datapaths.

10. The method of claim 9, wherein the predetermined location comprises an interface for receiving the reconfiguration request and for sending the partial bitstreams to the FPGA.

11. A method for reconfiguring an FPGA which has a static region and a dynamic region, the method comprising:
 (a) providing a dynamic module library storing predetermined modules;
 (b) receiving a reconfiguration request external to the FPGA;
 (c) computing reconfiguration of the FPGA at a predetermined location using the reconfiguration request and the predetermined module information from the dynamic module library, and generating reconfigurable partial bitstreams; and
 (d) sending partial bitstreams from the predetermined location to the FPGA to perform the reconfiguration;
 wherein the dynamic module library comprises a plurality of wrapper module structures, each module having a pre-processed module, a plurality of multiplexers, and a plurality of input and output ports, wherein the pre-processed module, the multiplexers and the input and output ports are interconnected.

12. A dynamic module system for reconfiguring an FPGA which has a static region and a dynamic region, comprising:
 an interface for receiving a reconfiguration request;
 a manager for receiving the reconfiguration request and information of predetermined modules, and determining placement and connections of modules inside the dynamic region of the FPGA; and
 a bitstream toolbox connected to the manager and generating a reconfigurable partial bitstream to the FPGA via the interface;
 wherein the manager is configured such that the modules to be located in the dynamic region are not constrained to lie within regions defined within the dynamic region, but instead may be placed as resources in the dynamic region allow.

13. The dynamic module system of claim 12, wherein the manager comprises:
 a datapath manager for determining the placement of the modules; and
 a channel routing manager for determining the connections of the modules.

14. The dynamic module system of claim 13, wherein the datapath manager further receives bitstreams that define configuration of the static region in the FPGA.

15. A dynamic module system for reconfiguring an FPGA which has a static region and a dynamic region, comprising:
 an interface for receiving a reconfiguration request;
 a manager for receiving the reconfiguration request and information of predetermined modules, and determining placement and connections of modules inside the dynamic region of the FPGA;
 a bitstream toolbox connected to the manager and generating a reconfigurable partial bitstream to the FPGA via the interface; and
 a reconfigurable supervisor connected between the interface and the datapath manager, the reconfigurable supervisor receiving the reconfiguration request from the interface and the predetermined module information, and generating a module request to the datapath manager;
 wherein the manager comprises:
 a datapath manager for determining the placement of the modules; and
 a channel routing manager for determining the connections of the modules; and
 wherein the datapath manager further receives bitstreams that define configuration of the static region in the FPGA.

16. The dynamic module system of claim 15, wherein the reconfigurable supervisor further receives information regarding dimensions and resources of the dynamic region of the FPGA.

17. The dynamic module system of claim 16, wherein the datapath manager comprises a placer for selecting modules for the dynamic region from the predetermined module information and determining placement and connections of the selected modules.

18. The dynamic module system of claim 17, wherein the placer further receives physical annotation information of the selected modules.

19. The dynamic module system of claim 18, wherein the datapath manager further comprises a router connected to the placer and generating interconnecting information to the bitstream toolbox.

* * * * *